United States Patent [19]

Hwang

[11] Patent Number: 5,359,219
[45] Date of Patent: Oct. 25, 1994

[54] SILICON ON INSULATOR DEVICE COMPRISING IMPROVED SUBSTRATE DOPING

[75] Inventor: Jeong-Mo Hwang, Plano, Tex.

[73] Assignee: Texas Instruments Incorporated, Dallas, Tex.

[21] Appl. No.: 985,976

[22] Filed: Dec. 4, 1992

[51] Int. Cl.$^5$ .................... H01L 27/01; H01L 27/12; H01L 31/392

[52] U.S. Cl. .................... 257/351; 257/347; 257/349; 257/350

[58] Field of Search ............... 257/347, 348, 349, 350, 257/351, 352, 353, 354, 57, 66

[56] References Cited

U.S. PATENT DOCUMENTS 4,907,053  3/1990  Ohmi .................................. 257/347
5,079,607  1/1992  Sakurai .............................. 257/350
5,103,277  4/1992  Caviglia et al. .................... 257/348

FOREIGN PATENT DOCUMENTS 4-146628  5/1992  Japan ................................ 257/351

*Primary Examiner*—Steven Ho Yin Loke
*Attorney, Agent, or Firm*—Brian A. Carlson; James C. Kesterson; Richard L. Donaldson

[57] ABSTRACT

A silicon on insulator integrated circuit device is provided which comprises a substrate (10), a buried oxide layer (12), and an outer silicon layer (14). A buried p-layer (16) and a buried n-well region (26) are formed in order to position p-n junctions beneath n-channel and p-channel devices respectively formed in the outer silicon layer (14) outwardly from the p-layer (16) and (n)-well (26).

16 Claims, 3 Drawing Sheets

SILICON ON INSULATOR DEVICE COMPRISING IMPROVED SUBSTRATE DOPING

TECHNICAL FIELD OF THE INVENTION

This invention relates in general to the field of silicon devices and more particularly to an improved silicon on insulator device and method for forming the same.

BACKGROUND OF THE INVENTION

A modern method of forming integrated circuit devices involves the formation of silicon devices in a thin film of single crystalline silicon material separated from a substrate of silicon material by a layer of buried oxide or insulator. This is commonly referred to as silicon on insulator construction or SOI construction. SOI construction allows for high performance silicon devices due to, among other reasons, the reduction in junction capacitance between diffused areas within the devices and the substrate.

The thickness of the buried oxide layer is an important consideration in SOI construction. If the buried oxide layer can be thinned, several advantages occur. Buried oxide layers are commonly formed by implanting oxygen through an outer surface of a substrate. The substrate is then annealed causing the implanted oxygen to react with the substrate to form the buried oxide layer. A thinner buried oxide layer can be formed using a lower dose of oxygen implant and thereby increase the throughput of the process used to form the buried oxide layer. A thin buried oxide layer also helps reduce the short channel effect involved with devices having channel lengths on the order of 5,000 angstroms or less. Devices having such short channel lengths commonly suffer from drain-induced barrier lowering due to field coupling through the buried oxide layer. By thinning the buried oxide layer, the short channel effect is reduced and the channel conductance is affected only by the gate electrode. An additional advantage of a thin buried oxide layer is that the thinner the buried oxide, the greater the heat dissipation through the substrate from the devices operating outwardly from the buried oxide layer.

The thinning of the buried oxide results in many advantages, but it is not without problems. First, the thinning of the buried oxide increases the drain to substrate capacitance which can result in reduced operating speeds of the devices formed outwardly from the buried oxide layer. Further, the thinner the buried oxide, the greater the risk of leakage through the buried oxide due to currents resulting from, for example, defects across the buried oxide layer.

Accordingly, a need has arisen for systems and methods for forming integrated circuit devices using SOI construction and thin buried oxide layers that prevent the disadvantages and problems associated with the thinning of the buried oxide layers.

SUMMARY OF THE INVENTION

In accordance with the teachings of the present invention, an SOI device and method of forming the same are provided that substantially eliminates or reduces disadvantages associated with prior methods and systems.

Specifically, a silicon on insulator device is provided that comprises a silicon substrate having a predetermined conductivity type. An insulating layer is formed outwardly from the silicon substrate. A silicon layer is formed outwardly from the insulating layer and is separated from the silicon substrate by the insulator layer. A first doped region is formed proximate the insulating layer and is separated from the outer silicon layer by the insulator layer. The first doped region comprises a conductivity type different than the predetermined conductivity type.

An important technical advantage of the systems and methods of the present invention inheres in the fact that the leakage common through thin buried oxide layers is greatly inhibited by the reverse-biased p-n junction formed in the buried doped regions which are placed beneath the buried insulating layer.

An additional technical advantage of the present invention inheres in the fact that the drain to substrate capacitance common with thin buried oxide layers is greatly reduced by interposing a p-n junction capacitance in series with the substrate silicon material disposed inwardly from the buried oxide layer.

BRIEF DESCRIPTION OF THE DRAWINGS

A more complete understanding of the teachings of the present invention may be acquired by referring to the detailed description of the invention in conjunction with the accompanying drawings in which like reference numbers indicate like features and wherein.

DETAILED DESCRIPTION OF THE INVENTION

Figure 1A:
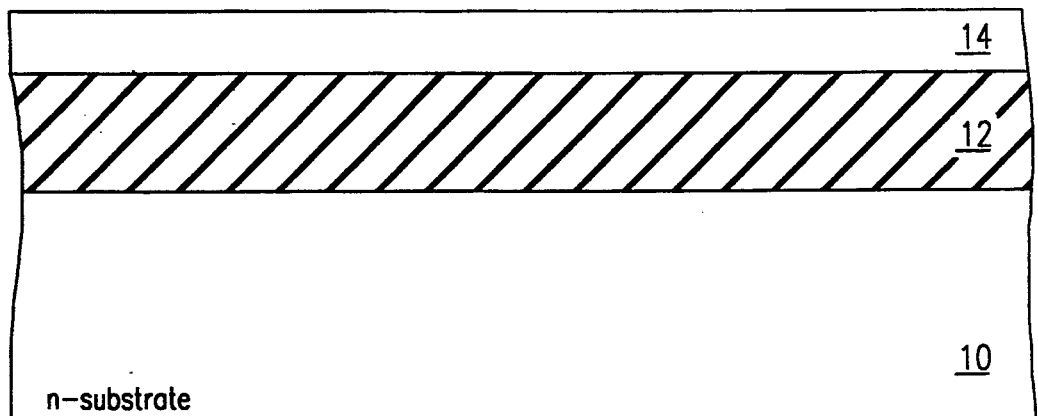
FIGS. 1a–1g are greatly enlarged cross-sectional schematic illustrations of the silicon on insulator silicon device constructed according to the teachings of the present invention.

Referring to FIG. 1a, an n-type silicon substrate 10 is illustrated. Substrate 10 comprises substantially single-crystalline silicon material that has been lightly doped with an n-type dopant such as phosphorous. Substrate 10 comprises a thin buried oxide layer 12 and an outer silicon layer 14.

Buried oxide layer 12 may be formed according to conventional methods by implanting oxygen atoms into substrate 10 and then annealing the atoms to form a buried layer of silicon dioxide. Buried oxide layer 12 may be on the order of 1,000 angstroms or larger in thickness. Outer silicon layer 14 may be on the order of 2,000 angstroms or less in thickness. The term "outer" shall be used to designate a direction away from substrate 10 and "inner" shall designate a direction toward substrate 10.

Figure 1B:
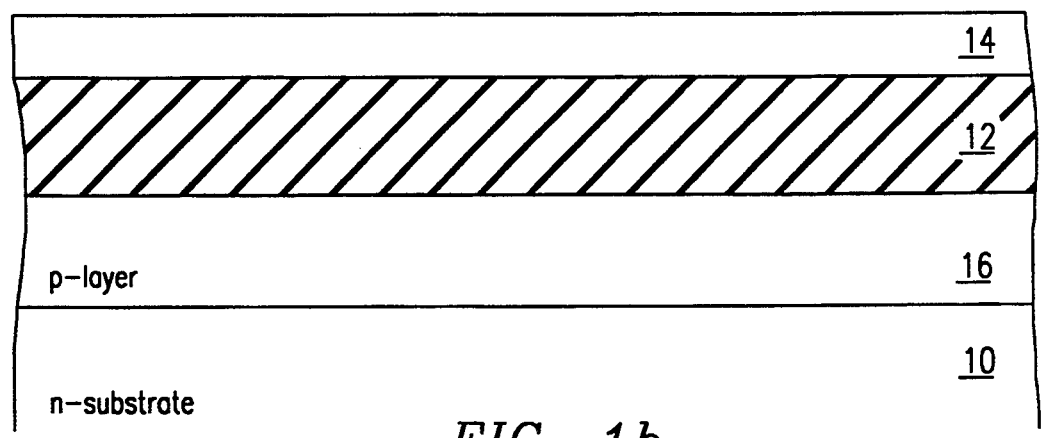

Referring to FIG. 1b, a p-layer 16 is formed in substrate 10 disposed inwardly from buried oxide layer 12. Buried p-layer 16 may be formed by implanting boron ions, having a sufficient energy such that buried p-layer 16 is on the order of 2,500 angstroms in depth and has a concentration on the order of $10^{16}$ ions per cubic centimeter.

Figure 1C:
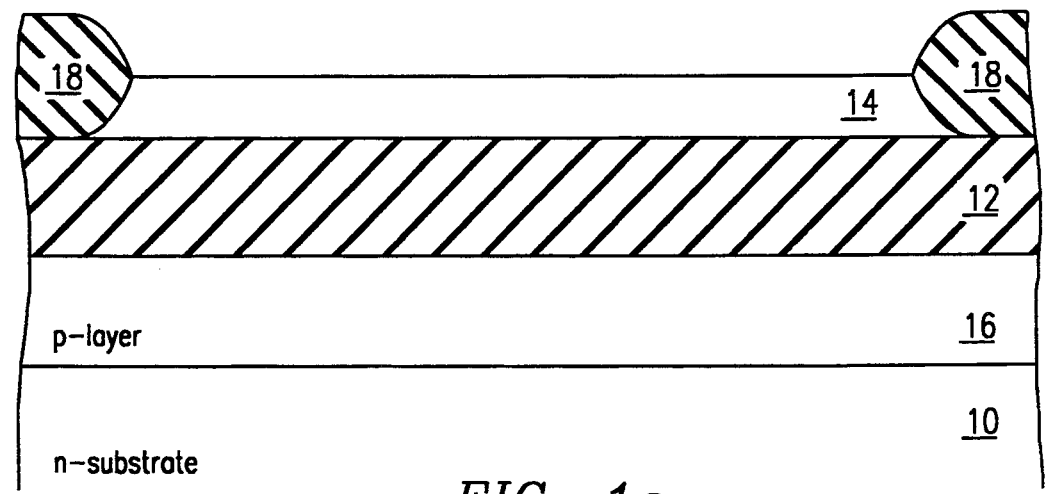

FIG. 1c illustrates the beginning of processing of CMOS silicon devices within outer silicon layer 14. This processing begins by defining an active region in which to form integrated circuit devices by selectively oxidizing portions of silicon layer 14 and thus forming field oxide regions 18 shown in FIG. 1c.

Figure 1D:
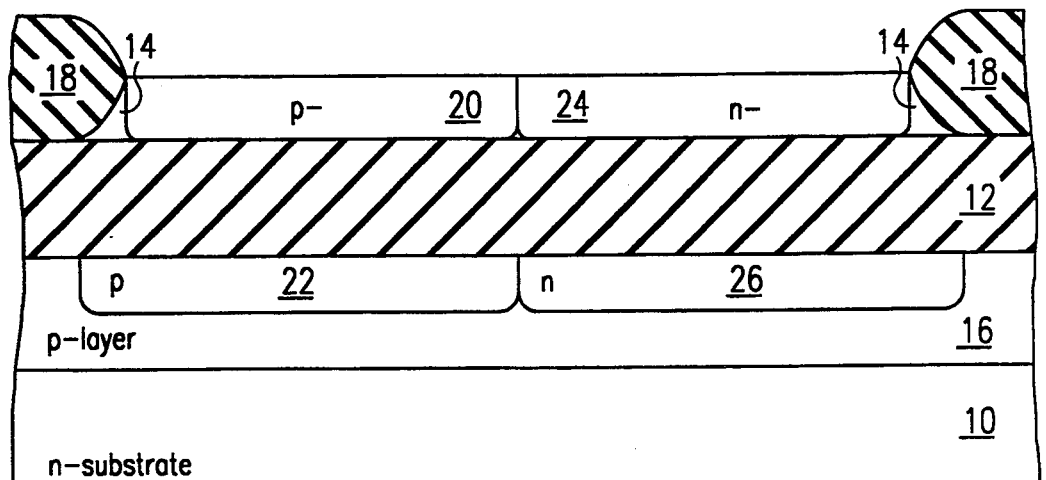

FIG. 1d illustrates the results of two separate implant procedures. The first implant step comprises a combination of an n-channel threshold voltage $V_T$ implant and a buried p-well formation. The n-channel $V_T$ implant forms a p-region 20 within the outer silicon layer 14.

The remainder of the substrate 10 is covered prior to the implant step using conventional photolithographic methods. p⁻-region 20 is formed by a low energy implant of boron ions. p⁻-region 20 comprises a concentration of boron ions on the order of $10^{16}$ to $10^{17}$ ions per cubic centimeter. Simultaneously with the formation of region 20, higher energy boron ions are implanted to form a p-region 22 shown in FIG. 1d. p-region 22 is formed to insure that the silicon material proximate the inward side of buried oxide layer 12 is p-type. The formation of p-layer 16 is on the order of twice as deep as p-region 22 from the buried oxide and therefore there is a possibility that portions of the silicon material proximate the buried oxide layer 12 may remain as an n-type even after the formation of p-layer 16. Accordingly, during the formation of p⁻-region 20, higher energy boron ions may be simultaneously implanted into the substrate 10 to form p-region 22 to insure that the silicon material immediately proximate the buried oxide layer 12 is in fact p-type. p-region 22 is on the order of 1,000 to 1,500 angstroms in depth.

Similar procedures are then used to form an n⁻-region 24 and a n-region 26 as shown in FIG. 1d. n⁻-region 24 is formed by photolithographically covering the remainder of the outer surface of the outer silicon layer 14 and implanting low energy phosphorous ions to a concentration on the order of $10^{16}$ to $10^{17}$ ions per cubic centimeter. In addition, higher energy phosphorous ions are included in the implant procedure to form buried n-well 26 proximate the inner interface of buried oxide layer 12. Buried n-region 26 comprises a concentration on the order of $10^{17}$ ions per cubic centimeter and is formed to have a depth on the order of 1,500 angstroms.

Important technical advantages of the teachings of the present invention can now be seen in the structure shown in FIG. 1d. The n⁻-region 24 provides the location for a p-channel MOS silicon device. This device enjoys the advantages inherent in the thin buried oxide layer 12. The disadvantages described previously that are associated with thin buried oxide layers are substantially reduced or eliminated by the placement of a p-n junction beneath the n⁻-region 24. The p-n junction is formed by the junction between n-region 26 and p-layer 16.

Similarly, the p⁻-region 20 serves as a location for an n-channel MOS device. The MOS device formed in p⁻-region 20 enjoys the advantages of the thin buried oxide layer 12 immediately beneath it. Additionally, the disadvantages commonly associated with thin buried oxide layers are greatly reduced or eliminated by the formation of a p-n junction immediately beneath buried oxide layer 12 and p⁻-region 20. The p-n junction beneath p⁻-region 20 is formed by the junction between p-layer 16 and n-type substrate 10. The p-n junctions described previously substantially reduce or eliminate the drain to substrate capacitance problems and also the problems of leakage currents that pass through the thin buried oxide layer 12.

Figure 1E:
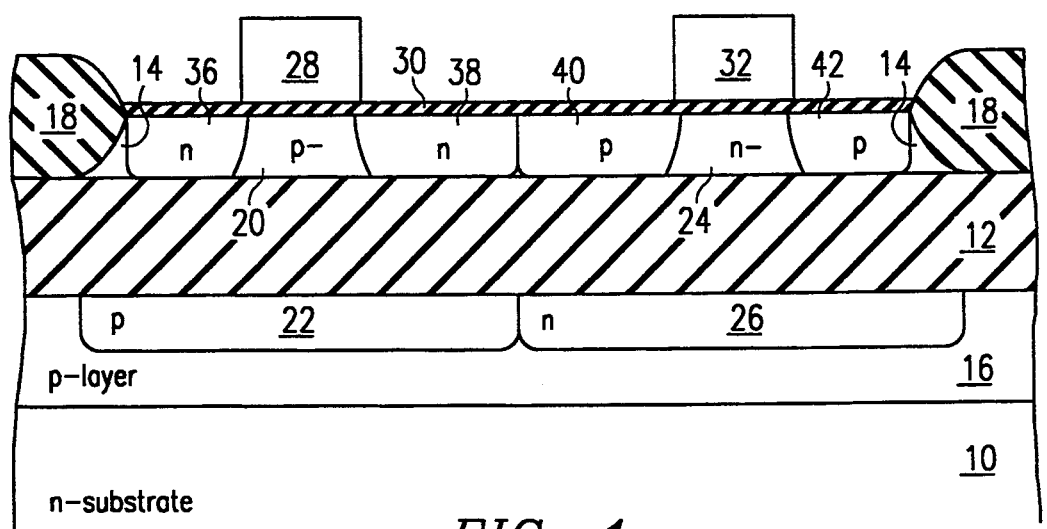
Figure 1F:
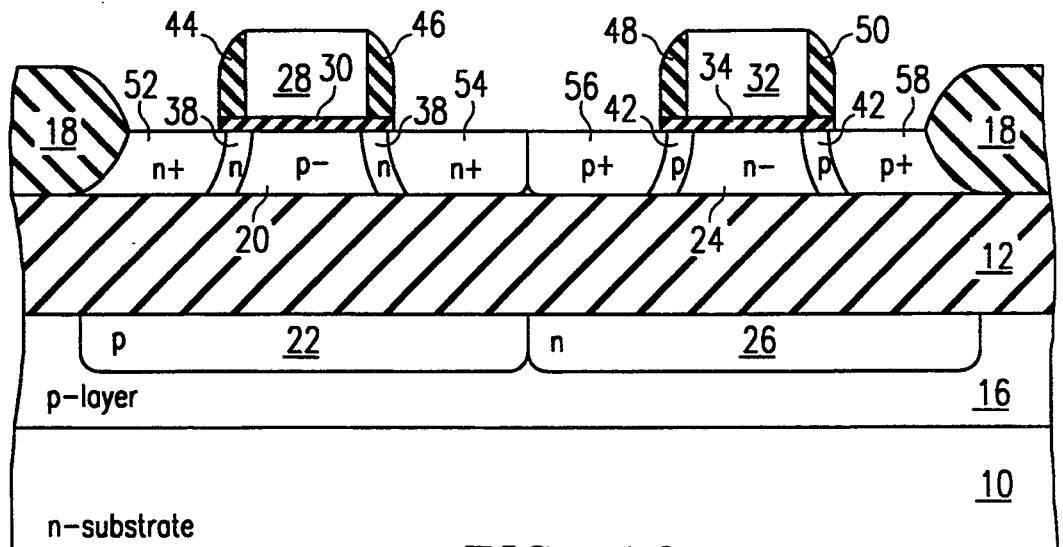
Figure 1G:
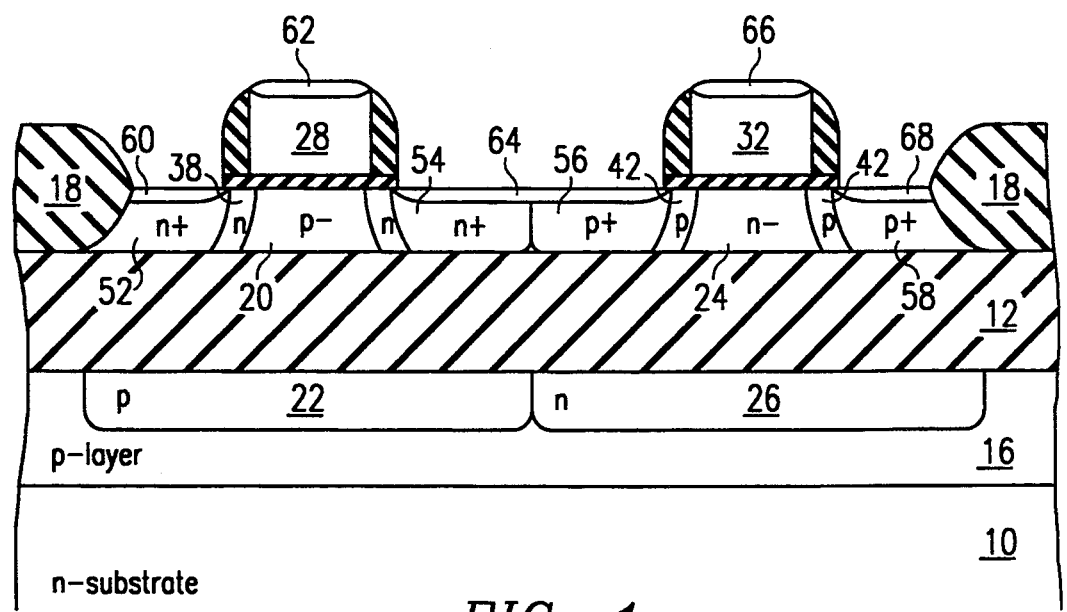

FIGS. 1e through 1g illustrate the formation of CMOS silicon devices in the p⁻-region 20 and n⁻-region 24 formed previously. For purposes of teaching the advantages of the present invention, the processes used to form a complementary pair of field effect transistors having their drains coupled together is shown. This configuration is commonly used in many CMOS circuit applications. Referring to FIG. 1e, the devices are formed by first growing a gate oxide layer 30 to a thickness on the order of 100 angstroms. A gate electrode layer which may comprise, for example, polycrystalline silicon is then deposited to a thickness on the order of 3,000 angstroms. The gate electrode layer is doped with sufficient ions to render it conductive. The gate electrode layer is then patterned and etched using conventional methods to form gate electrode 28 on p⁻-region 20. The same photolithographic processes form a gate electrode 32 on n⁻-region 24.

A first lightly-doped drain (LDD) implant step is then used to form n-region 36 and n-region 38 shown in FIG. 1e. A second LDD implant step is then used to form p-region 40 and p-region 42 shown in FIG. 1e. Regions 36, 38, 40 and 42 comprise ion concentrations on the order of $10^{18}$ ions per cubic centimeter. Referring to FIG. 1f, a layer of oxide is deposited over the entire structure. This layer is then anisotropically etched to form spacers 44, 46, 48 and 50 shown in FIG. 1f. At this time, the thin gate oxide layer 30 is also etched from the source/drain regions 52, 54, 56 and 58 to gate bodies. After the formations of spacers 44 through 50, a first n-channel source drain implant step is used to form n+source region 52 and n+drain region 54. A p-channel source drain implant step is then used to form p+ drain region 56 and p+ source region 58.

Referring to FIG. 1g, selected exposed silicon surfaces are treated to form silicide layers 60, 62, 64, 66 and 68. Silicide layers 60, 62, 64, 66 and 68 may comprise, for example, titanium silicide. Silicide layers 62 and 66 serve to greatly reduce sheet resistance of the gate electrodes 28 and 32, respectively. Titanium silicide layer 64 serves to couple the drains of the complementary MOS devices and to similarly reduce sheet resistance of the drain regions. In a similar fashion, silicide regions 60 and 68 greatly reduce sheet resistance in the sources of the n-channel and p-channel devices, respectively. Silicide layers 60, 62, 64, 66 and 68 may be formed to on the order of 500 angstroms or larger in depth.

It should be understood that while the teachings of the present invention have been illustrated herein with reference to the formation of complementary MOS devices in a silicon layer disposed outwardly from a thin buried oxide layer and buried wells, this choice is solely for the purposes of teachings the advantages of the present invention. The use of well regions disposed inwardly from thin buried oxide layers is widely applicable to a variety of device fabrication methods and can provide advantages in a variety of silicon integrated circuit implementations.

Although the present invention has been described with reference to the particular embodiment disclosed herein, it should be understood that the teachings of the present invention are not limited thereby and are solely defined by the spirit and scope of the appended claims.

What is claimed is:

1. A silicon on insulator device, comprising:
   a silicon substrate having a predetermined conductivity type;
   an insulating layer disposed outwardly from and substantially completely covering said silicon substrate;
   an outer silicon layer disposed outwardly from said insulating layer and separated from said silicon substrate by said insulating layer;
   a first doped region disposed proximate said insulating layer and separated from said outer silicon layer by said insulating layer, said first doped region comprising a conductivity type different than said predetermined conductivity type;

a second doped region disposed proximate said insulating layer and separated from said outer silicon layer by said insulating layer, said second doped region having said predetermined conductivity type, said second doped region separated from said silicon substrate by a portion of said first doped region;

a first integrated circuit device disposed in a portion of said outer silicon layer disposed outwardly from said first doped region; and a second integrated circuit device disposed in a portion of said outer silicon layer disposed outwardly from said second doped region.

2. The silicon on insulator device of claim 1 wherein the predetermined conductivity type comprises an n conductivity type.

3. The silicon on insulator device of claim 2, wherein the first integrated circuit device is an n-channel MOS device, and the second integrated circuit device is a p-channel MOS device.

4. The silicon on insulator device of claim 1 wherein said insulating layer is 1,000 angstroms or larger in thickness.

5. The silicon on insulator device of claim 1 wherein the outer silicon layer is 2,000 angstroms or less in thickness.

6. The silicon on insulator device of claim 1 wherein the first doped region is on the order of 2,500 angstroms in depth.

7. The silicon on insulator device of claim 1 wherein the second doped region is on the order of 1,500 angstroms in depth.

8. A silicon on insulator device, comprising:

a silicon substrate having a predetermined conductivity type;

an insulating layer disposed outwardly from and substantially completely covering said silicon substrate;

an outer silicon layer disposed outwardly from said insulating layer and separated from said silicon substrate by said insulating layer;

a first doped region disposed proximate said insulating layer and separated from said outer silicon layer by said insulating layer, said first doped region comprising a conductivity type different than said predetermined conductivity type; and a second doped region disposed proximate said insulating layer and separated from said outer silicon layer by said insulating layer, said second doped region having said conductivity type, said second doped region separated from said silicon substrate by a portion of said first doped region.

9. The silicon on insulator device of claim 8 wherein the predetermined conductivity type comprises an n conductivity type.

10. The silicon on insulating device of claim 9, said device further comprising a p-channel silicon device disposed in a portion of said outer silicon layer disposed outwardly from said second doped region.

11. The silicon on insulator device of claim 8 wherein said insulating layer is 1,000 angstroms or larger in thickness.

12. The silicon on insulator device of claim 8 wherein the outer silicon layer is 2,000 angstroms or less in thickness.

13. The silicon on insulator device of claim 8 wherein the first doped region is on the order of 2,500 angstroms in depth.

14. The silicon on insulator device of claim 8 wherein the second doped region is on the order of 1,500 angstroms in depth.

15. The silicon on insulator device of claim 8 wherein the first doped region comprises a concentration on the order of $10^{16}$ ions per cubic centimeter.

16. The silicon on insulator device of claim 8 wherein the second doped region comprises a concentration on the order of $10^{17}$ ions per cubic centimeter.

* * * * *